(12) United States Patent
Chen et al.

(10) Patent No.: US 11,973,156 B2
(45) Date of Patent: Apr. 30, 2024

(54) EQUIPMENT AND METHOD FOR PRODUCING SOLAR CELL STRING

(71) Applicant: SUZHOU XIAONIU AUTOMATION EQUIPMENT CO., LTD, Suzhou (CN)

(72) Inventors: Shigeng Chen, Suzhou (CN); Yonggang Wu, Suzhou (CN); Qifei Ge, Suzhou (CN); Yong Yang, Suzhou (CN); Biao Yin, Suzhou (CN); Xiangxiang Ma, Suzhou (CN)

(73) Assignee: SUZHOU XIAONIU AUTOMATION EQUIPMENT CO., LTD, Suzhou (CN)

( * ) Notice: Subject to any disclaimer, the term of this patent is extended or adjusted under 35 U.S.C. 154(b) by 0 days.

(21) Appl. No.: 18/343,237

(22) Filed: Jun. 28, 2023

(65) Prior Publication Data

US 2023/0361233 A1    Nov. 9, 2023

Related U.S. Application Data

(63) Continuation of application No. PCT/CN2023/088169, filed on Apr. 13, 2023.

(30) Foreign Application Priority Data

Sep. 15, 2022  (CN) .......................... 202222438089.2
Sep. 16, 2022  (CN) .......................... 202211126312.8
Dec. 5, 2022   (CN) .......................... 202223234612.6

(51) Int. Cl.
*B23K 1/00*     (2006.01)
*H01L 21/677*   (2006.01)
(Continued)

(52) U.S. Cl.
CPC ............ *H01L 31/05* (2013.01); *B23K 1/0016* (2013.01); *H01L 21/67706* (2013.01); *H01L 31/1876* (2013.01)

(58) Field of Classification Search
CPC . B23K 1/0016; H01L 31/188; H01L 31/0504; H01L 21/67706
See application file for complete search history.

(56) References Cited

U.S. PATENT DOCUMENTS

2003/0127124 A1 * 7/2003 Jones .................... H01L 31/188
                                                    136/244
2009/0056784 A1 * 3/2009 Reinisch ............. H01L 31/0516
                                                    136/244
(Continued)

FOREIGN PATENT DOCUMENTS

CN  210015865 U   2/2020
CN  110911522 A   3/2020
(Continued)

*Primary Examiner* — Erin B Saad

(57) ABSTRACT

A solar cell string production equipment includes first and second conveying devices, first and second carrying devices, and a transfer device. The first conveying device has a first continuous conveyor belt, the second conveying device has a second continuous conveyor belt, and the first and second continuous conveyor belts can turn and convey in the vertical direction. Back and front films are laid on the first conveying device. The first conveying device can transport the back film on the first continuous conveyor belt to the second continuous conveyor belt. The transfer device can transport the pressing tool from the terminal of the second continuous conveyor belt to the front film on the first continuous conveyor belt. The second carrying device can transport the pressing tool and front film stacked together to the second continuous conveyor belt. A solar cell string production method is further provided.

5 Claims, 19 Drawing Sheets

(51) Int. Cl.
    *H01L 31/05*     (2014.01)
    *H01L 31/18*     (2006.01)

(56) References Cited

U.S. PATENT DOCUMENTS

| | | | |
|---|---|---|---|
| 2012/0080508 A1* | 4/2012 | Schultz | B23K 1/0016 |
| | | | 228/179.1 |
| 2012/0228363 A1* | 9/2012 | Risch | H01L 31/188 |
| | | | 228/103 |
| 2013/0272833 A1* | 10/2013 | Duncan | B25J 9/1697 |
| | | | 414/800 |
| 2014/0060615 A1* | 3/2014 | Gretler | H01L 31/0516 |
| | | | 156/580 |
| 2014/0065747 A1* | 3/2014 | Duncan | H01L 31/0504 |
| | | | 257/E31.124 |
| 2020/0202404 A1* | 6/2020 | Clevenger | G06Q 30/0613 |
| 2023/0006089 A1* | 1/2023 | Li | H01L 31/188 |
| 2023/0271279 A1* | 8/2023 | Yang | H01L 31/188 |
| | | | 228/244 |

FOREIGN PATENT DOCUMENTS

| | | | |
|---|---|---|---|
| CN | 111403553 A | 7/2020 | |
| CN | 112490333 A | 3/2021 | |
| CN | 114833504 A | 8/2022 | |
| CN | 115206858 A | 10/2022 | |
| WO | 2008145368 A2 | 12/2008 | |

* cited by examiner

EQUIPMENT AND METHOD FOR PRODUCING SOLAR CELL STRING

CROSS-REFERENCE TO RELATED APPLICATIONS

This application is a continuation of International Patent Application No. PCT/CN2023/088169, filed on Apr. 13, 2023, which claims the benefit of priority from Chinese Patent Applications No. 202211126312.8 filed on Sep. 16, 2022, No. 202222438089.2 filed on Sep. 15, 2022, and No. 202223234612.6 filed on Dec. 5, 2022. The content of the aforementioned application, including any intervening amendments thereto, is incorporated herein by reference in its entirety.

TECHNICAL FIELD

This application relates to solar cell string production, and more particularly to an equipment and method for producing a solar cell string.

BACKGROUND

In the production of an emerging solar cell string, the N-th cell is stacked on the second half of the N-th solder ribbon group; the first half of the (N+1)-th solder ribbon group is stacked on the N-th cell; the (N+1)-th cell is stacked on the second half of the (N+1)-th solder ribbon group; and the solder ribbon groups on the front and back sides of each cell are fixed to the cell using films. The solder ribbon group includes multiple solder ribbons, and the number of solder ribbons is the same as the number of grid lines to be connected on the cell. N is a positive integer.

When producing such solar cell strings, the back film and the front film are alternately transported to the working platform along different paths using two conveyor lines, rendering the production equipment structurally complicated.

SUMMARY

In view of the deficiencies in the prior art, this application provides a production equipment and method of a solar cell string.

In a first aspect, this application provides an equipment for producing a solar cell string, including:
  a first conveying device;
  a second conveying device;
  a first carrying device;
  a transfer device;
  a second carrying device; and
  a film-supplying device;
  wherein the first conveying device includes a first continuous conveyor belt having a first horizontal section and a first side section; and a conveying direction of the first continuous conveyor belt is from the first horizontal section to the first side section;
  the second conveying device includes a second continuous conveyor belt having a second horizontal section and a second side section; and a conveying direction of the second continuous conveyor belt is from the second side section to the second horizontal section;
  the second continuous conveyor belt and the first continuous conveyor belt are arranged in parallel; and the first side section and the second side section are located on the same side with respect to the first horizontal section and the second horizontal section;
  the first carrying device is provided in front of the first side section and the second side section, and is configured to carry a back film from the first side section to the second side section;
  the transfer device is configured to transfer and place a pressing tool from an output end of the second horizontal section to a front film on the first horizontal section;
  the second carrying device is provided between an output end of the first horizontal section and an input end of the second horizontal section; and the second carrying device is configured to carry the front film and the pressing tool in stacked arrangement from the output end of the first horizontal section to the input end of the second horizontal section;
  the film-supplying device is provided on a side of an input end of the first horizontal section, and is configured to prepare and lay a film group at the input end of the first horizontal section; wherein the film group includes the back film and the front film; and
  the first continuous conveyor belt and the second continuous conveyor belt are each provided with suction holes for holding the back film and the front film.

In an embodiment, the transfer device includes a gripping device; the gripping device is provided between the input end of the first horizontal section and the output end of the second horizontal section; and the gripping device is configured for gripping the pressing tool from the output end of the second horizontal section and stacking the pressing tool on the front film.

In an embodiment, the transfer device includes a first gripping device, a third continuous conveyor belt, and a second gripping device; the first gripping device is located above the output end of the second horizontal section; the third continuous conveyor belt is located above a middle of the second horizontal section; the second gripping device is located between the first continuous conveyor belt and the third continuous conveyor belt; a conveying direction of the third continuous conveyor belt is opposite to a conveying direction of the second horizontal section; the first gripping device is configured for gripping the pressing tool from the output end of the second horizontal section and placing the pressing tool at an input end of the third continuous conveyor belt; the second gripping device is located on a side of an output end of the third continuous conveyor belt, and located close to the second carrying device; and the second gripping device is configured for gripping the pressing tool from the output end of the third continuous conveyor belt.

In an embodiment, the transfer device further includes a buffering mechanism and a carrying mechanism;
  the buffering mechanism is provided above a middle of the first horizontal section, and is configured for carrying the pressing tool gripped by the second gripping device from the output end of the third continuous conveyor belt; and
  the carrying mechanism includes a power unit and a manipulator; the manipulator is provided above the first horizontal section, and is configured for carrying and placing the pressing tool from the buffering mechanism to the front film; and the power unit is connected with the manipulator to drive the manipulator to move up and down and reciprocate along the conveying direction of the first continuous conveyor belt.

In an embodiment, the part of the manipulator facing the first continuous conveyor belt is the first suction part.

In an embodiment, a width of the third continuous conveyor belt is less than a length of the pressing tool; lifting plates are provided symmetrically on both sides of the third continuous conveyor belt; the lifting plates are capable of moving up and down; in a first state, an upper surface of the lifting plates is lower than an upper surface of the third continuous conveyor belt; in a second state, the upper surface of the lifting plates is higher than the upper surface of the third continuous conveyor belt; and a projection of each of the lifting plates does not coincide with a projection of the second gripping device.

In an embodiment, the first conveying device further includes a heating device; and the heating device is located at a middle of the second horizontal section.

In an embodiment, the second carrying device includes a first gripping mechanism and a second gripping mechanism;
the first gripping mechanism includes a first gripper and a second gripper; and
the first gripper includes a plurality of suction cups; the plurality of suction cups are configured for holding the pressing tool and the front film at a bottom of the pressing tool; the second gripper is arranged parallel to the first gripper; the second gripper is configured to hold a portion of the front film beyond an edge of the pressing tool; and the second gripping mechanism is configured to grip a solar cell next to the front film.

This application further provides a method for producing a solar cell string using the equipment, including:
(S1) continuously preparing and laying, by the film-supplying device, a film at the input end of the first horizontal section; and conveying, by the first continuous conveyor belt, the film forward every time the film is laid;
(S2) after the film is transported to the first side section, transporting, by the first carrying device, the film to the second side section as a first back film; transporting, by the second continuous conveyor belt, the first back film to the input end of the second horizontal section; and stacking sequentially a first solder ribbon and a first solar cell on the first back film, wherein a second half of the first solder ribbon is located on the first back film;
(S3) conveying, by the second continuous conveyor belt, a second back film forward to the input end of the second horizontal section; and stacking a second solder ribbon on the second back film and allowing a first half of the second solder ribbon to be stacked on the first solar cell;
(S4) carrying and placing, by the second carrying device, a first front film and the pressing tool stacked together from the output end of the first horizontal section to the first solar cell; and stacking a second solar cell on a second half of the second solder ribbon;
(S5) repeating steps (S3) and (S4) followed by heating to obtain the solar cell string, wherein after transported by the second continuous conveyor belt to the output end of the second horizontal section, the pressing tool is transferred by the transfer device to a second front film on the first horizontal section for reuse.

In an embodiment, the step (S4) further includes:
stacking the pressing tool on the front film on the first continuous conveyor belt.

In an embodiment, in step (S1), at least first three films provided by the film-supplying device are used as back films; and remaining films are alternately used as the front film and the back film.

In an embodiment, in step (S5), the transfer device includes a gripping device; and the pressing tool is gripped by the gripping device and stacked on the second front film at the input end of the first horizontal section.

In an embodiment, in step (S5), the transfer device includes a first gripping device, a third continuous conveyor belt, and a second gripping device; the first gripping device is configured to grip and place the pressing tool at an input end of the third continuous conveyor belt; the pressing tool is conveyed to an output end of the third continuous conveyor belt; and the second gripping device is configured to grip and stack the pressing tool on the second front film near the output end of the first horizontal section.

In an embodiment, in step (S5), the transfer device further includes a buffering mechanism and a carrying mechanism;
the buffering mechanism is located above a middle of the first horizontal section;
the second gripping device grips and places the pressing tool from the output end of the third continuous conveyor belt to the buffering mechanism; and
the carrying mechanism includes a power unit and a manipulator; the manipulator is located above the first horizontal section; and the manipulator carries the pressing tool on the buffering mechanism to the second front film.

In this application, the solar cell string production equipment includes a first conveying device, a second conveying device, a first carrying device, a transfer device and a second carrying device. The first conveying device has a first continuous conveyor belt, the second conveying device has a second continuous conveyor belt, and the first continuous conveyor belt and the second continuous conveyor belt can turn and convey in the vertical direction. The first conveyor device is provided with a back film and a front film. The first conveyor device can transport the back film located on the first side section of the first continuous conveyor belt to the second side section of the second continuous conveyor belt. The transfer device can transport the pressing tool at the output end of the second horizontal section of the second continuous conveyor belt to the front film at the first horizontal section of the first continuous conveyor belt. The second handling device can transport the stacked pressing tool and the front film to the second horizontal section of the second continuous conveyor belt. The back and front films are conveyed by the first continuous conveyor belt, and the solar cell string is produced on the second continuous conveyor belt, simplifying the structure of the solar cell string production equipment. Moreover, the pressing tool can be repeatedly used, and the structure of the production equipment is optimized.

The solar cell string production method provided herein can achieve the continuous production of solar cell strings, allowing for improved production efficiency.

BRIEF DESCRIPTION OF THE DRAWINGS

In order to illustrate the technical solutions of the embodiments of the present disclosure or in the prior art more clearly, the drawings required in the description of the embodiments of the disclosure or the prior art will be briefly described below. Obviously, presented in the drawings are merely some embodiments of the present disclosure, which are not intended to limit the disclosure. For those skilled in the art, other drawings may also be obtained according to the drawings provided herein without paying creative efforts.

In the figures: 1—first continuous conveyor belt; 2—second continuous conveyor belt; 3—first carrying device; 4—transfer device; 41—first gripping device; 42—second gripping device; 43—third continuous conveyor belt; 44—third gripping device; 45—limit plate; 46—lifting plate; 47—buffering mechanism; 471—synchronous belt; 472—baffle; 48—carrying mechanism; 481—power unit; 482—manipulator; 4821—first suction part; 5—second carrying device; 51—connecting plate; 52—first suction plate; 53—second suction plate; 54—slide cylinder; 55—first suction cup; 56—second suction cup; 57—third suction cup; 58—first gripping mechanism; 581—first gripper; 5811—fourth suction cup; 582—second gripper; 59—second gripping mechanism; 6—film-supplying device; 7—first feeding device; 8—second feeding device; 9—heating device; 100—back film; 200—front film; 300—pressing tool; 400—solar cell; and 500—solder ribbon.

DETAILED DESCRIPTION OF EMBODIMENTS

The technical solutions of the disclosure will be clearly and completely described below with reference to the accompanying drawings and embodiments. Obviously, described below are merely some embodiments of the disclosure, which are not intended to limit the disclosure. For those skilled in the art, other embodiments obtained based on these embodiments without paying creative efforts should fall within the scope of the disclosure defined by the appended claims.

In order to allow those skilled in the art to better understand the technical solutions of the disclosure, the disclosure will be further described in detail below in conjunction with the accompanying drawings and embodiments.

Figure 1:
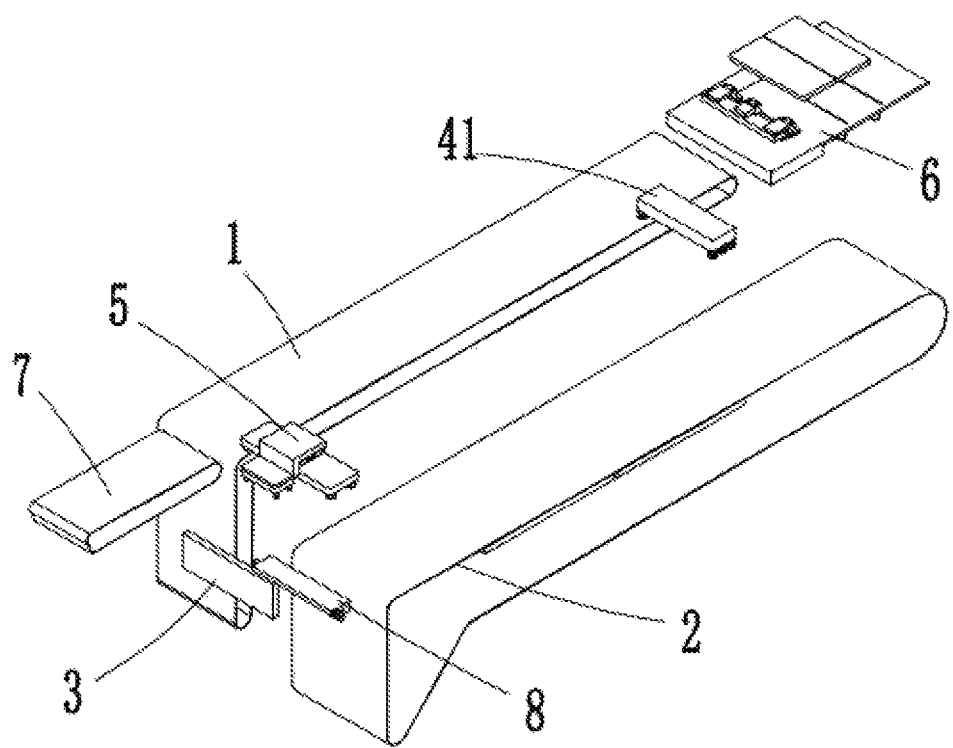
FIG. 1 is a perspective view of a solar cell string production equipment according to a first embodiment of the present disclosure.
Figure 2:
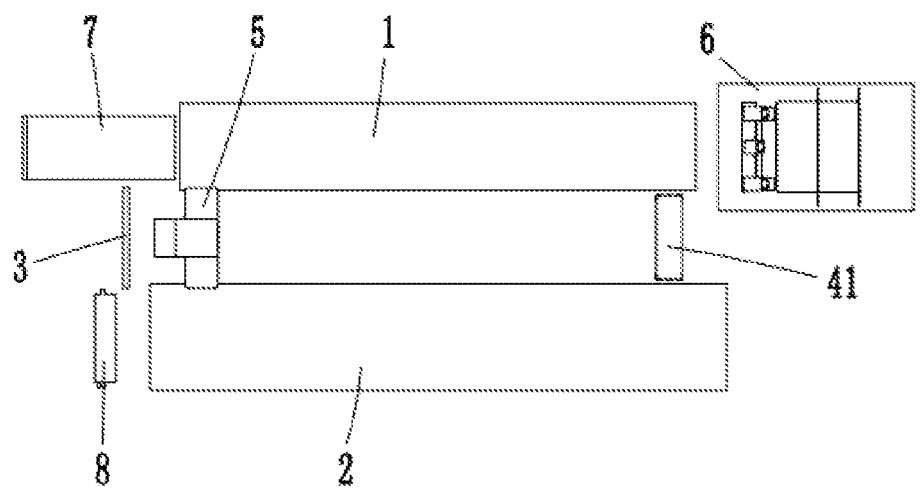
FIG. 2 is a top view of the production equipment according to the first embodiment of the present disclosure.
Figure 3:
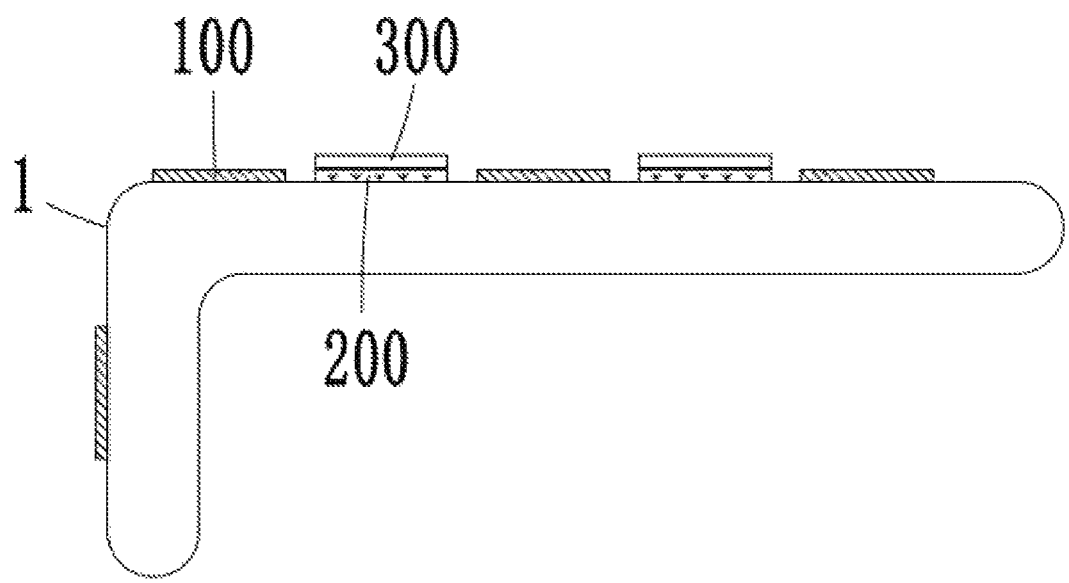
FIG. 3 schematically shows a first conveying state of a first continuous conveyor belt according to the first embodiment of the present disclosure.

Referring to FIGS. 1-3, a solar cell string production equipment is provided, which includes a rack, and a first conveying device, a second conveying device, a first carrying device 3, a transfer device 4, and a second carrying device 5 disposed on the rack.

The first conveying device includes a first continuous conveyor belt 1 having a first horizontal section and a first side section. A conveying direction of the first continuous conveyor belt 1 is from the first horizontal section to the first side section. The second conveying device includes a second continuous conveyor belt 2 having a second horizontal section and a second side section. The second continuous conveyor belt 2 and the first continuous conveyor belt 1 are arranged in parallel. A conveying direction of the second continuous conveyor belt 2 is from the second side section to the second horizontal section. The angle between the first side section of the first continuous conveyor belt 1 and the first horizontal section of the first continuous conveyor belt 1 is the same as the angle between the second side section of the second continuous conveyor belt 2 and the second horizontal section of the second continuous conveyor belt 2. The first side section of the first continuous conveyor belt 1 and the second side section of the second continuous conveyor belt 2 are located on the same side with respect to the first horizontal section of the first continuous conveyor belt 1 and the second horizontal section of the second continuous conveyor belt 2. The first continuous conveyor belt 1 and the second continuous conveyor belt 2 are wound on a drive shaft distributed at a right angle or an obtuse angle to make a turn in the vertical direction. Further, the first continuous conveyor belt 1 and the second continuous conveyor belt 2 are each provided with suction holes that can hold the back film 100 and the front film 200, thereby remaining stable during the conveying process. Specifically, the first continuous conveyor belt 1 and the second continuous conveyor belt 2 form a sealed cavity inside, and a negative pressure is formed in the sealed cavity, so that the back film 100 and the front film 200 can be held on the first continuous conveyor belt 1 and the second continuous conveyor belt 2.

The first carrying device 3 is disposed in front of the first side section of the first continuous conveyor belt 1 and the second side section of the second continuous conveyor belt 2, for carrying the back film 100 from the first side section of the first continuous conveyor belt 1 to the second side section of the second continuous conveyor belt 2. The first carrying device 3 includes a drive device and a suction member capable of holding the back film 100. The suction member may be a plate provided with a suction cup on a side wall of the plate. The plate is directly opposite the first side section and the second side section. The drive device can drive the suction member to reciprocate in the X direction and Y direction. The adsorption force of the suction member is greater than the holding force of the first continuous conveyor belt 1, so that the back film 100 can be removed from the first continuous conveyor belt 1 and placed on the second continuous conveyor belt 2. The suction member can be opened and closed, thereby controlling the suction member to produce the holding force. It should be noted that in the disclosure, the X direction is parallel to the extension direction of the first horizontal section or the second horizontal section, the Y direction is horizontally perpendicular to the X direction, and the Z direction is vertically perpendicular to the X direction.

The transfer device 4 is configured to transfer and place a pressing tool 300 from the output end of the second horizontal section to a front film 200 on the first horizontal section.

The second carrying device 5 is located between the output end of the first horizontal section of the first continuous conveyor belt 1 and the input end of the second horizontal section of the second continuous conveyor belt 2. The second carrying device is used to carry the front film 200 and the pressing tool 300 in stacked arrangement from the output end of the first horizontal section of the first continuous conveyor belt 1 to the input end of the second horizontal section of the second continuous conveyor belt 2.

In the production equipment of the solar cell string, the second horizontal section of the second continuous conveyor belt 2 is used as a working platform for producing the solar cell strings. The first carrying device 3 carries the back film 100 from the first side section of the first continuous conveyor belt 1 to the second side section of the second continuous conveyor belt 2. After the pressing tool 300 and the front film 200 are carried to the output end of the first horizontal section of the first continuous conveyor belt 1, the pressing tool 300 and the front film 200 are transported to the second horizontal section of the second continuous conveyor belt 2 by the second carrying device 5. After the pressing tool 300 is transported to the output end of the second continuous conveyor belt 2, and then transferred by the transfer device 4 to the front film 200 on the first horizontal section of the first continuous conveyor belt 1. Therefore, the back film 100 and the front film 200 can be conveyed by the same conveyor line, and the pressing tool 300 can be recycled, optimizing the structure of the production equipment of the solar cell string.

The production equipment of the solar cell string further includes a film-supplying device 6. The film-supplying device 6 is provided on a side of the input end of the first horizontal section of the first continuous conveyor belt 1, for preparing and laying a film group at the input end of the first horizontal section of the first continuous conveyor belt 1. The film group includes the back film 100 and the front film 200. The number of films prepared and placed by the film-supplying device 6 each time is not limited, which can meet the needs of the production equipment of the solar cell string. In the disclosure, the difference between the back film 100 and the front film 200 is merely that the back film 100 is on the back of the solar cell 400 in the solar cell string, and the front film 200 is on the front of the solar cell 400 in the solar cell string. The structures of the back film 100 and the front film 200 are the same, and both the back film 100 and the front film 200 are adhesive film after being heated, so the back film 100 and the front film 200 can be prepared by the film-supplying device 6 at the same time.

Referring to FIGS. 1-3 again, in the first embodiment, the transfer device 4 includes a first gripping device 41 and a drive device. The first gripping device 41 is provided between the input end of the first horizontal section of the first continuous conveyor belt 1 and the output end of the second horizontal section of the second continuous conveyor belt 2. The first gripping device 41 can grip the pressing tool 300 from the output end of the second horizontal section of the second continuous conveyor belt 2 and stack the pressing tool 300 on the front film 200 of the input end of the first horizontal section of the first continuous conveyor belt 1. The drive device can drive the first gripping device 41 to implement reciprocating motion in the Y, Z direction. The first gripping device 41 may be a gripper or suction member, which can clamp or adsorb the pressing tool 300.

Figure 4:
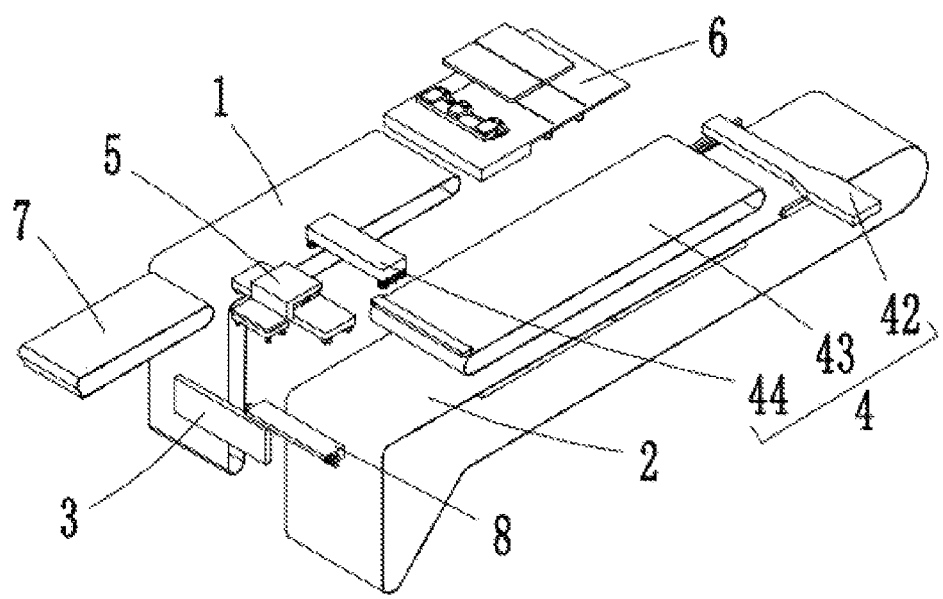
FIG. 4 is a perspective view of the solar cell string production equipment according to a second embodiment of the present disclosure.
Figure 5:
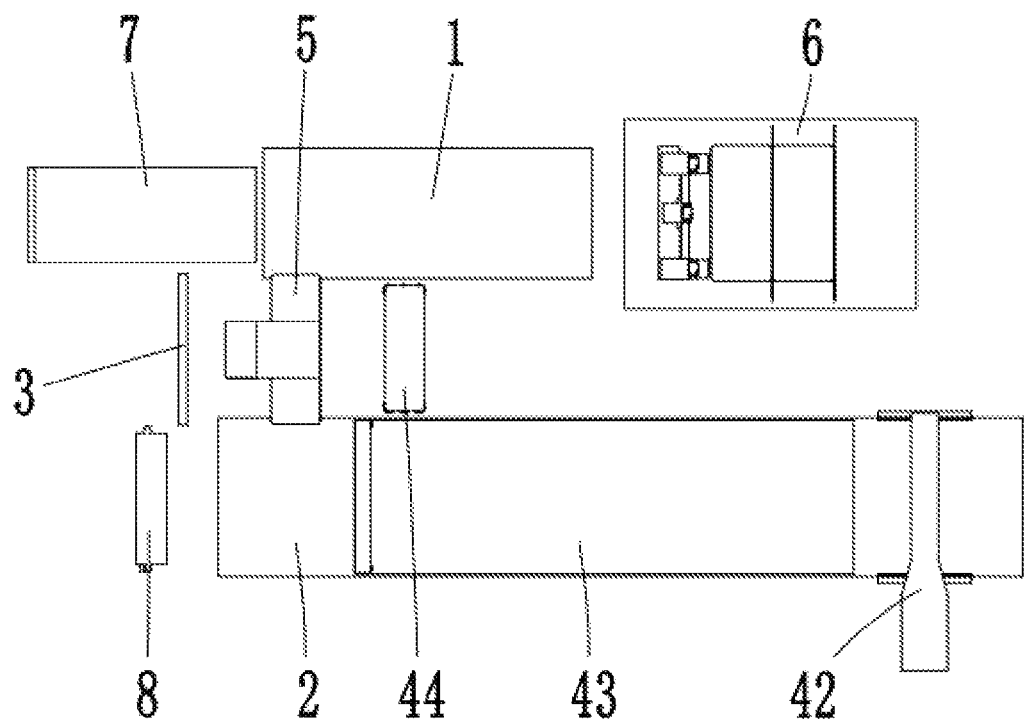
FIG. 5 is a top view of the solar cell string production equipment according to the second embodiment of the present disclosure.
Figure 6:
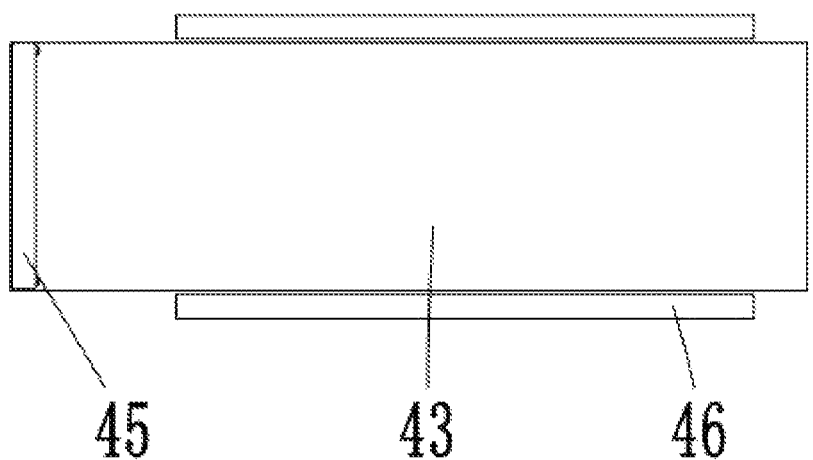
FIG. 6 partially shows a structure of a transfer device according to the second embodiment of the present disclosure.
Figure 7:
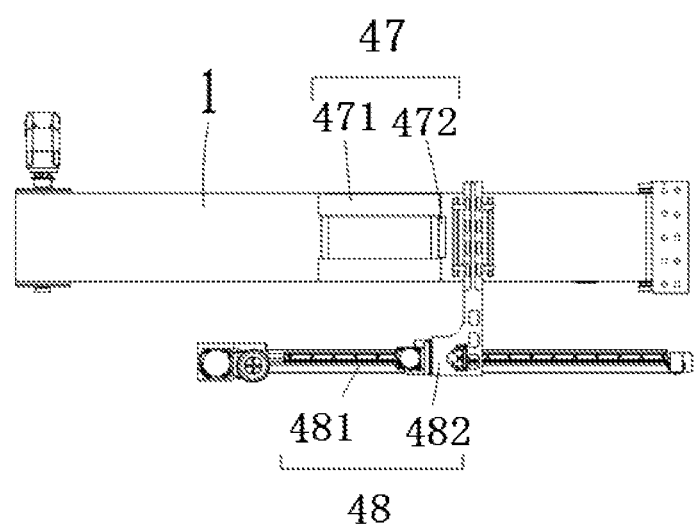
FIG. 7 is a top view showing a partial structure of the transfer device according to the second embodiment of the present disclosure.
Figure 8:
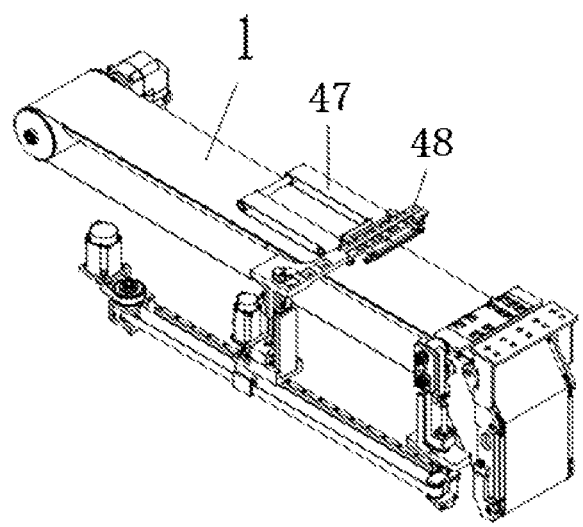
FIG. 8 is a partial perspective view of the transfer device according to the second embodiment of the present disclosure.
Figure 9:
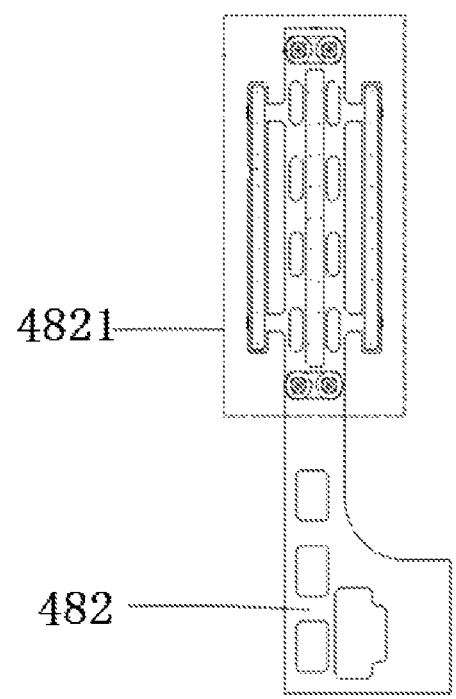
FIG. 9 is a top view of a manipulator according to the second embodiment of the present disclosure.
Figure 10:
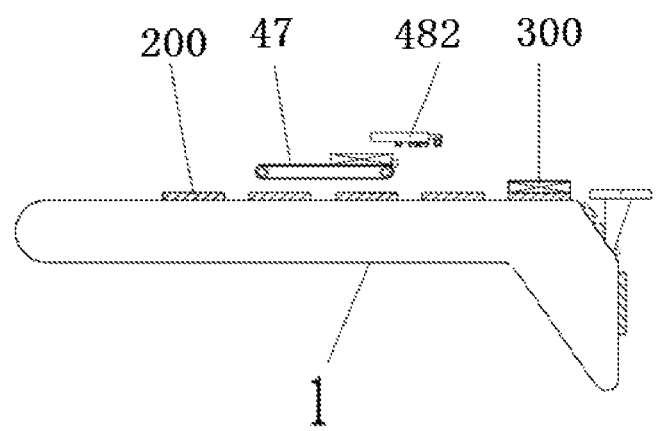
FIG. 10 schematically shows a working state of the solar cell string production equipment according to the second embodiment of the present disclosure.

Referring to FIGS. 4-6, in the second embodiment, the transfer device 4 includes a second gripping device 42, a third continuous conveyor belt 43, and a third gripping device 44. The second gripping device 42 is located above the output end of the second horizontal section of the second continuous conveyor belt 2. The third continuous conveyor belt 43 is located above the middle of the second horizontal section of the second continuous conveyor belt 2. The third gripping device 44 is located between the first continuous conveyor belt 1 and the third continuous conveyor belt 43. The conveying direction of the third continuous conveyor belt 43 is opposite to the conveying direction of the second horizontal section of the second continuous conveyor belt 2. The second gripping device 42 can grab the pressing tool 300 from the output end of the second horizontal section of the second continuous conveyor belt 2 and place the pressing tool 300 at the input end of the third continuous conveyor belt 43. The third gripping device 44 is located on a side of the output end of the third continuous conveyor belt 43, and the third gripping device 44 is located close to the second carrying device 5. The third gripping device 44 can grip the pressing tool 300 from the output of the third continuous conveyor belt 43 and stack the pressing tool 300 on the front film 200. Specifically, the structure of the second gripping device 42 and the third gripping device 44 is the same as the structure of the first gripping device 41, which will not be repeated herein. The second gripping device 42 is connected to the drive device and is capable of reciprocating movement in the X and Z directions. The third gripping device 44 is connected to the drive device and can reciprocate movement in the Y and Z directions. After the pressing tool 300 is stacked on the front film 200, the stacked pressing tool 300 and front film 200 are transmitted over a long distance through the first continuous conveyor belt 1, which is easy to misalign the pressing tool 300 and the front film 200, making it difficult for the second carrying device 5 to grip the pressing tool 300. Since the output end of the third continuous conveyor belt 43 is close to the output end of the first horizontal section of the first continuous conveyor belt 1, the distance that the pressing tool 300 is conveyed after stacked on the front film 200 can be reduced, thereby reducing the risk of misalignment between the pressing tool 300 and the front film 200.

In this embodiment, a limit plate 45 is provided above the output end of the third continuous conveyor belt 43. When the pressing tool 300 is conveyed to the output end of the third continuous conveyor belt 43, the limit plate 45 will block the pressing tool 300 forward. In this embodiment, a buffer station of the pressing tool 300 is also provided to meet the number required for the pressing tool 300 in the production equipment of solar cell string. Specifically, the width of the third continuous conveyor belt 43 is less than the length of the pressing tool 300, and when the pressing tool 300 is placed on the third continuous conveyor belt 43, the ends of the pressing tool 300 extend out of the third continuous conveyor belt 43. Lifting plates 46 are provided symmetrically on both sides of the third continuous conveyor belt 43, and the lifting plates 46 can move up and down. In the first state, the upper surface of the lifting plates 46 is lower than the upper surface of the third continuous conveyor belt 43. In the second state, the upper surface of the lifting plates 46 is higher than the upper surface of the third continuous conveyor belt 43. The lifting plate 46 and the third continuous conveyor belt 43 may be covered with the pressing tools 300. After the pressing tools 300 on the third continuous conveyor belt 43 all flow into the production line of the solar cell string, the lifting plate 46 will move down to place the pressing tools 300 thereon on the third continuous conveyor belt 43 and flow into the production line of the solar cell string. The projection of each of the lifting plates 46 does not coincide with a projection of the third gripping device 44 to keep clear the second carrying device 5.

Referring to FIGS. 7-10, in the second embodiment, the transfer device 4 further includes a buffering mechanism 47 and a carrying mechanism 48. The buffering mechanism 47 is provided above the middle of the first horizontal section of the first continuous conveyor belt 1 for carrying the pressing tool 300 gripped by the third gripping device 44 from the output end of the third continuous conveyor belt 43. The buffering mechanism 47 includes a synchronous belt 471 and a baffle 472. The carrying mechanism 48 includes a power unit 481 and a manipulator 482 disposed above the first horizontal section of the first continuous conveyor belt 1, for carrying and placing the pressing tool 300 from the buffering mechanism 47 to the front film 200. The power unit 481 is connected to the manipulator 482 to drive the manipulator 482 such that the manipulator 482 can move up and down and reciprocate along the conveying direction of the first continuous conveyor belt 1. The portion of the manipulator 482 facing the first continuous conveyor belt 1 is the first suction part 4821. The manipulator 482 may has the same structure as the second gripping device 42 and the third gripping device 44, capable of reciprocating motion in the X and Z directions, which will not be repeated herein. During production, according to the actual situation, the third gripping device 44 can grab the pressing tool 300 from the output end of the third continuous conveyor belt 43 and stack the pressing tool 300 on the front film 200. Or the third gripping device 44 can grab the pressing tool 300 and store the pressing tool 300 on the synchronous belt 471 of the buffering mechanism 47, and the baffle 472 blocks the pressing tool 300 to prevent the pressing tool 300 from falling. When it is necessary to use the pressing tool 300 on the buffering mechanism 47, the power unit 481 of the carrying mechanism 48 drives the manipulator 482 to move and drives the first suction part 4821 to suction the pressing tool 300 on the buffering mechanism 47 and place the pressing tool 300 on the front film 200 near the output end of the first continuous conveyor belt 1. Such a design increases productivity and prevents the accumulation of materials.

Figure 11:
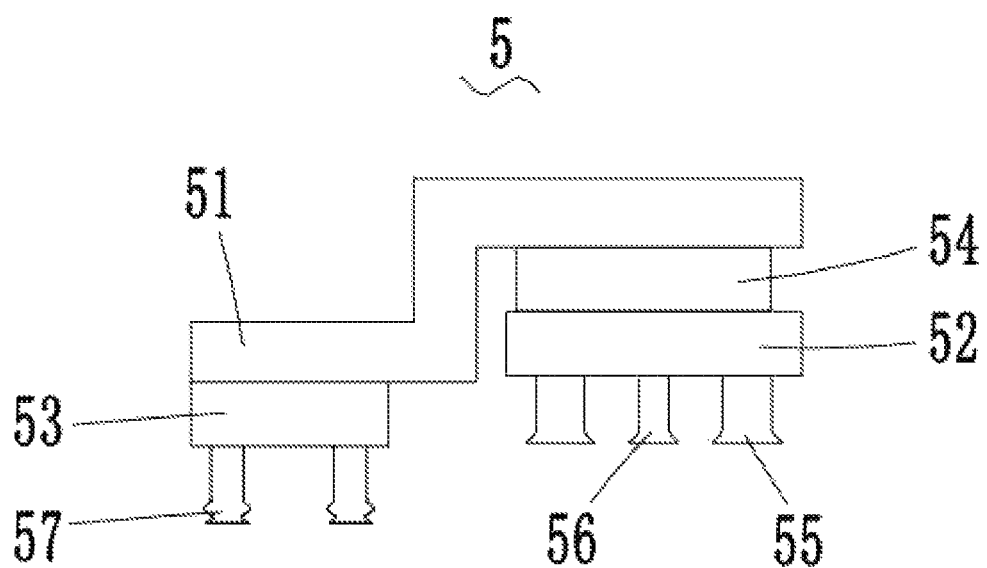
FIG. 11 is a front view of a second carrying device according to an embodiment of the present disclosure.

As shown in FIG. 11, the production equipment further includes a first feeding device 7 for feeding the solar cell 400 and a second feeding device 8 for feeding the solder ribbon 500. The first feeding device 7 is located at a side of the output end of the first horizontal section of the first continuous conveyor belt 1 for providing the solar cell 400. The second feeding device 8 can draw the solder ribbon 500 at the input end of the second horizontal section of the second continuous conveyor belt 2 for providing the solder ribbon 500. The position of the first feeding device 7 near the output end of the first horizontal section of the first continuous conveyor belt 1 is the gripping station of the solar cell 400, and the solar cell 400 is provided on the gripping station. The second carrying device 5 can simultaneously grab the stacked pressing tool 300 and the front film 200 and the solar cell 400. In an embodiment, the second carrying device 5 includes a connecting plate 51, a first gripping mechanism 58 and a second gripping mechanism 59. The first gripping mechanism 58 and the second gripping mechanism 59 are connected by the connecting plate 51 and are distributed at both ends of the connecting plate 51. The first gripping mechanism 58 grabs the stacked pressing tool 300 and the front film 200, and the second gripping mechanism 59 grabs the solar cell 400. In an embodiment, the first gripping mechanism 58 includes a first suction plate 52, a slide cylinder 54, a first suction cup 55, and a second suction cup 56. The second gripping mechanism 59 includes a second suction plate 53 and a third suction cup 57. In an embodiment, the connecting plate 51 is a Z-shaped plate. The first suction plate 52 and the second suction plate 53 are located at both ends of the bottom of the connecting plate 51. The first suction plate 52 and the connecting plate 51 are connected by the slide cylinder 54 to adjust the spacing between the first suction plate 52 and the second suction plate 53. The first suction cup 55 and the second suction cup 56 are located at the bottom of the first suction plate 52. The first suction cup 55 has two rows for adsorbing the pressing tool 300. The second suction cup 56 is located between two rows of first suction cups 55 for adsorbing the front film 200. After the first suction cup 55 contacts the upper surface of the pressing tool 300, the suction force can be generated to suction the pressing tool 300. The part of the pressing tool 300 directly opposite the second suction cup 56 is provided with a through hole, because the contact surface of the pressing tool 300 and the front film 200 is smooth, the adsorption force generated by the second suction cup 56 can lift the front film 200 through the through hole. The third suction cup 57 is located at the bottom of the second suction plate 53 for adsorbing the solar cell 400. By adjustment function of the slide cylinder 54, the distance between the solar cell 400 and the pressing tool 300 or between the solar cell 400 and the front film 200 can be adjusted to accommodate the spacing between the cells 400 in the solar cell string.

Figure 12:
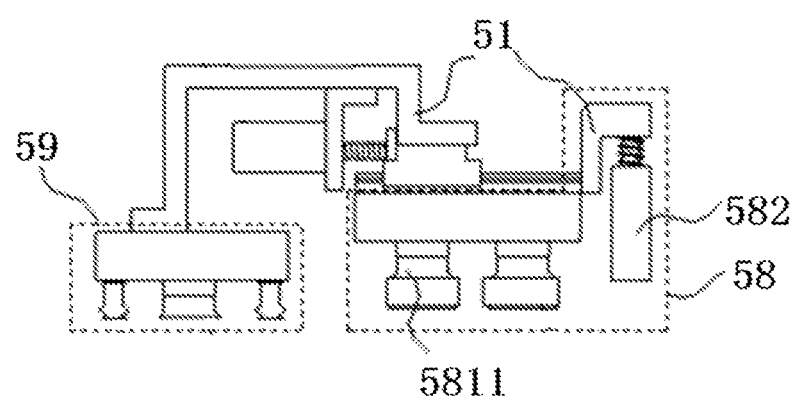
FIG. 12 is a front view of the second carrying device according to another embodiment of the present disclosure.
Figure 13:
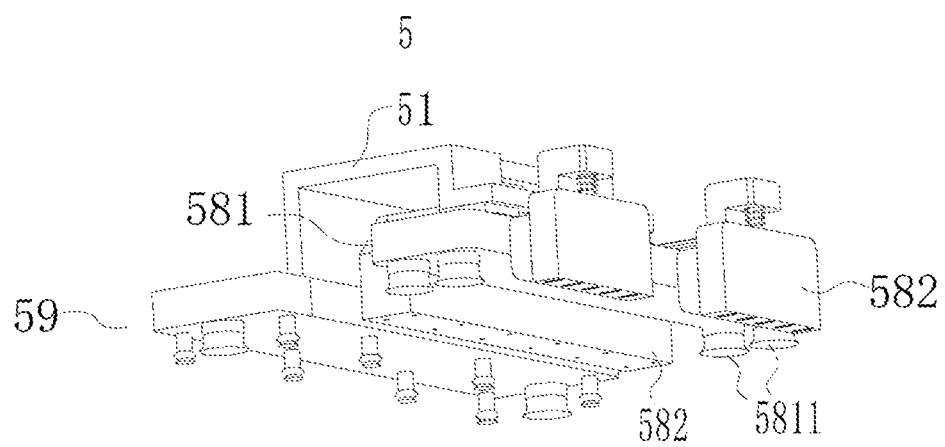
FIG. 13 is a partial perspective view of the second carrying device according to another embodiment of the present disclosure.
Figure 14:
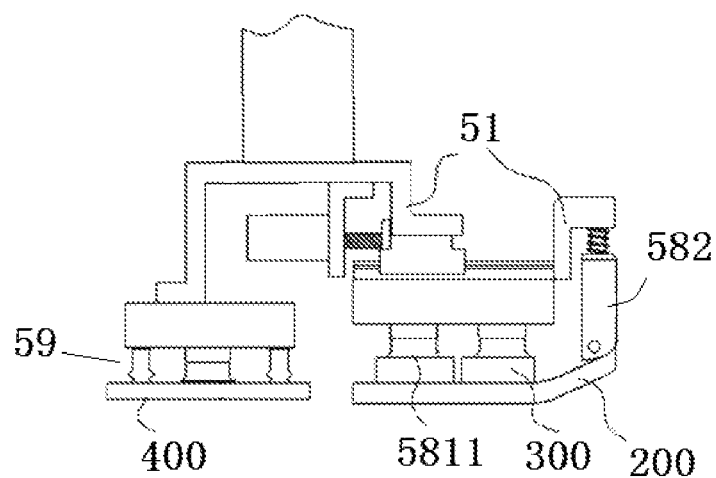
FIG. 14 schematically shows a use state of the second carrying device according to another embodiment of the present disclosure.
Figure 15:
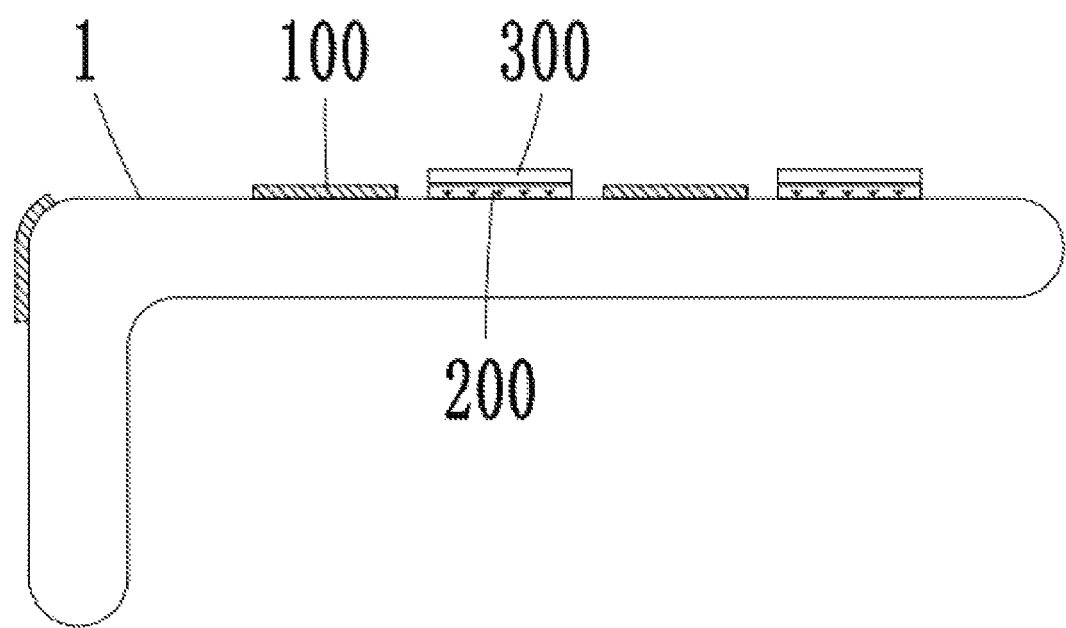
FIG. 15 schematically shows a second conveying state of the first continuous conveyor belt.
Figure 16:
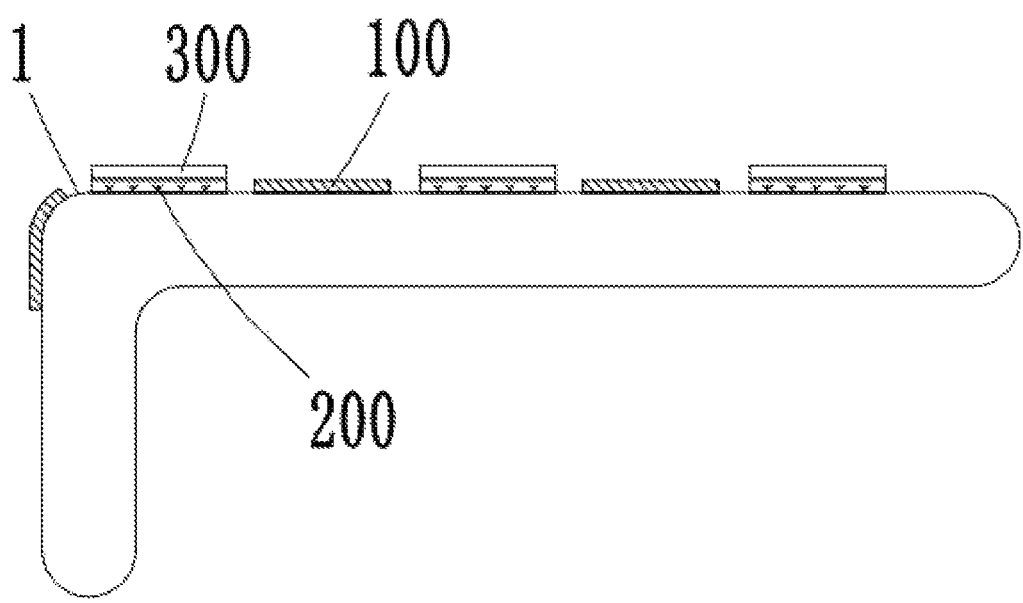
FIG. 16 schematically shows a third conveying state of the first continuous conveyor belt.
Figure 17:
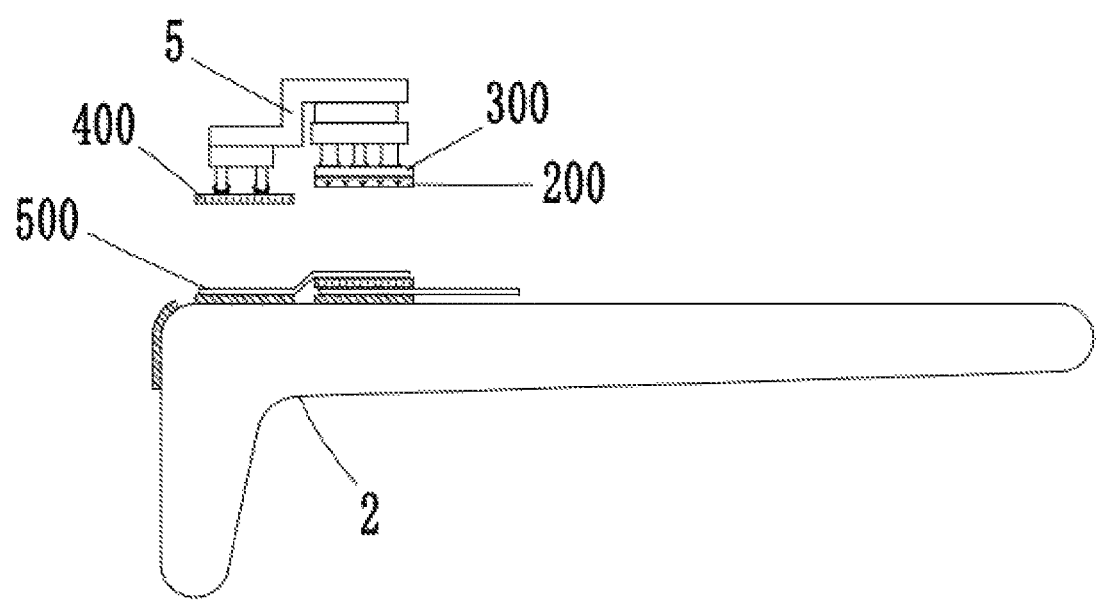
FIG. 17 schematically shows a first conveying state of a second continuous conveyor belt.
Figure 18:
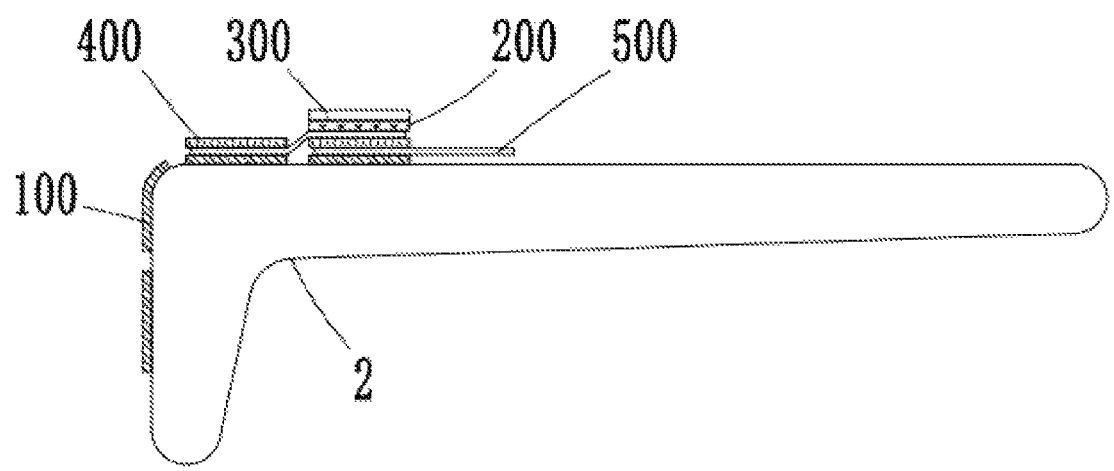
FIG. 18 schematically shows a second conveying state of the second continuous conveyor belt.
Figure 19:
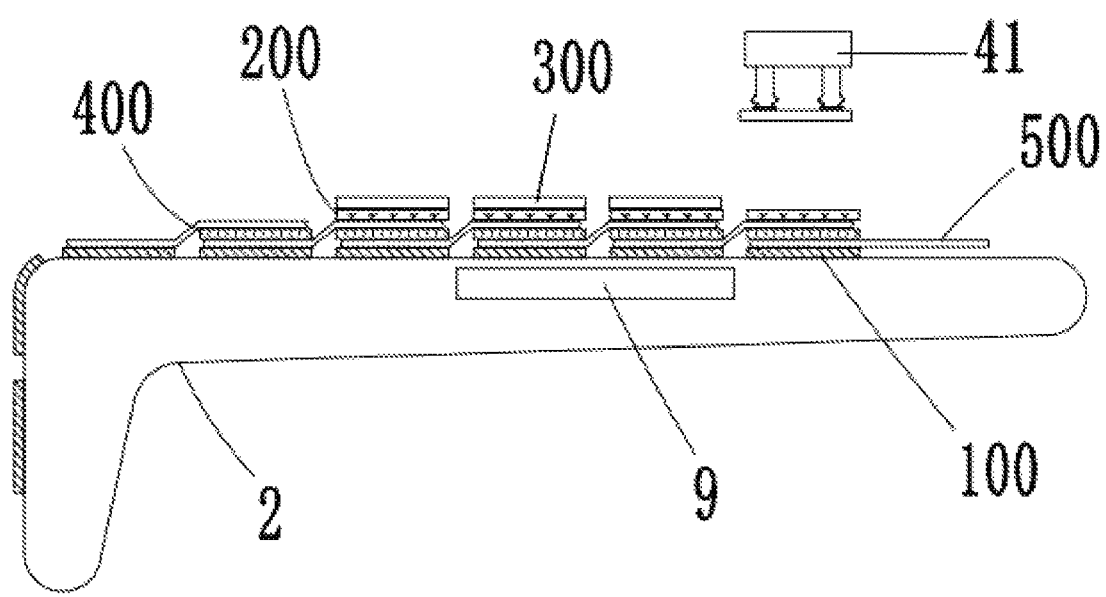
FIG. 19 schematically shows a third conveying state of the second continuous conveyor belt.

Referring to FIGS. 12 to 14, the second embodiment of the second carrying device is provided. The first gripping mechanism 58 includes a first gripper 581 and a second gripper 582. The first gripper 581 includes a plurality of fourth suction cups 5811. The plurality of fourth suction cups 5811 for holding the pressing tool 300 and the front film 200 at a bottom of the pressing tool 300. Difference from the second carrying device 5 in the first embodiment is that the side of the first gripper 581 is also provided with the second gripper 582. As shown in FIG. 12, the second gripper 582 is provided on a side of the first gripper 581. As shown in FIG. 13, the two sides of the first gripper 581 are respectively provided with the second gripper 582, the second gripper 582 is arranged parallel to the first gripper 581, and the second gripper 582 is used to hold a portion of the front film 200 beyond the edge of the pressing tool 300. The ways that the second gripping mechanism 59 grabs the solar cell 400 next to the front film 200 and that the plurality of fourth suction cup 5811 absorbs the pressing tool 300 and the front film 200 on the bottom of the pressing tool 300 are the same as the way in the first embodiment of the second carrying device 5, which will not be repeated herein. It should be noted here that when the two sides of the first gripper 581 are provided with the second gripper 582 respectively, and the held front film 200 exceeds the edge of the pressing tool 300, the front film 200 below the pressing tool 300 may not require the fourth suction cups 5811.

Referring to FIGS. 15-19, a solar cell string production method is further provided, which is performed through the following steps using the solar cell string production equipment.

(S1) The film-supplying device 6 continuously prepares and lays a film at the input end of the first horizontal section of the first continuous conveyor belt 1. The first continuous conveyor belt 1 performs a conveying operation every time the film is laid at the input end of the first horizontal section.

(S2) After the film is transported to the first side section of the first continuous conveyor belt 1, the first carrying device 3 transports the film to the second side section of the second continuous conveyor belt 2 as a first back film 100. The second continuous conveyor belt 2 transports the first back film 100 to the input end of the second horizontal section of the second continuous conveyor belt 2. A first solder ribbon 500 and the first solar cell 400 are stacked sequentially on the first back film 100, so that the second half of the first solder ribbon 500 is located on the first back film 100.

(S3) The second continuous conveyor belt 2 continues to convey the second back film 100 forward to the input end of the second horizontal section. A second solder ribbon 500 is stacked on the second back film 100, so that the second half of the second set of solder ribbons 500 is stacked on the second back film 100, and a front half of the second solder ribbon 500 is stacked on the first solar cell 400.

(S4) The second carrying device 5 carries and places the first front film 200 and the pressing tool 300 stacked together from the output end of the first horizontal section of the first continuous conveyor belt 1 to the first solar cell 400. Further, a second solar cell 400 is stacked on a second half of the second solder ribbon 500.

(S5) The steps (S3)-(S4) are repeated followed by heating to obtain the solar cell string. The second continuous conveyor belt 2 is transported forward in a step-by-step manner. The pressing tool 300 is transported by the second continuous conveyor belt 2 to the output end of the second horizontal section of the second continuous conveyor belt 2. The transfer device 4 transfers the pressing tool 300 to the front film 200 on the first horizontal section of the first continuous conveyor belt 1, so that the pressing tool 300 is recycled.

In an embodiment, the input end of the first horizontal section of the first continuous conveyor belt 1 is transported forward once every time the film is laid. It can be understood that every time the film is laid on the input end of the first horizontal section of the first continuous conveyor belt 1, the first continuous conveyor belt will move to the output end of the first continuous conveyor belt 1 once.

In an embodiment, one film is laid once at the input end of the first horizontal section of the first continuous conveyor belt 1, the first continuous conveyor belt 1 is transported forward once, and one film is transported to the output end of the first continuous conveyor belt 1 at a time.

Or every time N films are laid, the first continuous conveyor belt 1 is transported forward once, and M films are transported to the output end of the first continuous conveyor belt 1, where N is a natural number greater than 1, M is a natural number less than N.

Or every time N films are laid, the first continuous conveyor belt 1 is transported forward once, and N films are transported to the output end of the first continuous conveyor belt 1 at a time.

Or every time N films are laid, the first continuous conveyor belt 1 is transported forward once, and one film is transported to the output end of the first continuous conveyor belt 1 at a time.

In step (S4), the pressing tool 300 is stacked on the front film 200 on the first continuous conveyor belt 1, thereby forming the stacked front film 200 and the pressing tool 300.

In step (S1), at least first three films provided by the film-supplying device 6 are used as the back films 100, and the remaining films are alternately used as the front film 200 and the back film 100, so that the production equipment of the solar cell string can continuously work.

In step (S5), the transfer device 4 includes the first gripping device 41. The first gripping device 41 grabs and stacks the pressing tool 300 on the second front film 200 located at the input end of the first horizontal section of the first continuous conveyor belt 1.

In step (S5), the transfer device 4 includes the second gripping device 42, the third continuous conveyor belt 43, and the third gripping device 44. The second gripping device 42 grips and places the pressing tool 300 at the input end of the third continuous conveyor belt 43. The pressing tool 300 is conveyed to the output end of the third continuous conveyor belt 43, and the third gripping device 44 grips and stacks the pressing tool 300 on the front film 200 near the output end of the first horizontal section of the first continuous conveyor belt 1, thereby forming the stacked front film 200 and pressing tool 300.

In step (S5), the transfer device 4 further includes the buffering mechanism 47 and the carrying mechanism 48. The buffering mechanism 47 is located above the middle of the first horizontal section of the first continuous conveyor belt 1. The third gripping device 44 grips the pressing tool 300 from the output of the third continuous conveyor belt 43 and places the pressing tool 300 on the buffering mechanism 47. The carrying mechanism 48 includes the power unit 481 and the manipulator 482 disposed above the first horizontal section of the first continuous conveyor belt 1. The manipulator 482 carries the pressing tool 300 on the buffering mechanism 47 and places the pressing tool 300 on the second front film 200, thereby forming the stacked second front film 200 and the pressing tool 300.

In step (S4), the solar cell 400 and the stacked front film 200 and the pressing tool 300 are transported and placed together by the second carrying device 5.

In the production method, the second conveying device further includes a heating device 9. The heating device 9 is located inside the middle of the second horizontal section of the second continuous conveyor belt 2, which can heat the solar cell string from the bottom of the solar cell string. The heating device 9 is an electric heater. When the heating device 9 generates the heat energy to reach the solar cell string above the heating device 9, the back film 100 and the front film 200 can be heated, thereby making the back film 100 and the front film 200 viscous, and the solder ribbon 500 and the solar cell 400 will be bonded together.

The present disclosure has been described in detail above in conjunction with the accompanying drawings and embodiments. It should be noted that embodiments are merely used to facilitate the understanding of the present disclosure. It should be understood that any modifications and replacements made by those skilled in the art without departing from the spirit of the disclosure should fall within the scope of the disclosure defined by the present claims.

What is claimed is:

1. A method for producing a solar cell string, comprising:
   (S1) continuously preparing, by a film-supplying device, a film; supplying, by the film-supplying device, the film to an input end of a first horizontal section of a first continuous conveyor belt; and conveying, by the first continuous conveyor belt, the film forward every time the film is laid;
   (S2) supplying, by the film-supplying device, the film to a first carrying device; transporting, by the first carrying device, the film to a side section of a second continuous conveyor belt as a first back film; transporting, by the second continuous conveyor belt, the first back film to an input end of a second horizontal section of the second continuous conveyor belt; and stacking sequentially a first solder ribbon and a first solar cell on the first back film, wherein a second half of the first solder ribbon is located on the first back film;
   (S3) conveying, by the second continuous conveyor belt, a second back film forward to the input end of the second horizontal section; and stacking a second solder ribbon on the second back film and allowing a first half of the second solder ribbon to be stacked on the first solar cell;
   (S4) carrying, by a second carrying device, a first front film and a pressing tool stacked together from an output end of the first horizontal section to the first solar cell; and stacking a second solar cell on a second half of the second solder ribbon; and
   (S5) repeating steps (S3) and (S4) followed by heating to obtain the solar cell string, wherein after transported by the second continuous conveyor belt to an output end of the second horizontal section, the pressing tool is transferred by a transfer device to a second front film on the first horizontal section for reuse.

2. The method of claim 1, wherein the step (S4) further comprises:
   stacking the pressing tool on the first front film on the first continuous conveyor belt.

3. The method of claim 2, wherein in step (S5), the transfer device comprises a gripping device; and the pressing tool is gripped by the gripping device and stacked on the second front film at the input end of the first horizontal section.

4. The method of claim 2, wherein in step (S5), the transfer device comprises a first gripping device, a third continuous conveyor belt, and a second gripping device; the first gripping device is configured to grip and place the pressing tool at an input end of the third continuous conveyor belt; the pressing tool is conveyed to an output end of the third continuous conveyor belt; and the second gripping device is configured to grip and stack the pressing tool on the second front film near the output end of the first horizontal section.

5. The method of claim 4, wherein in step (S5), the transfer device further comprises a buffering mechanism and a carrying mechanism;
   the buffering mechanism is located above a middle of the first horizontal section;
   the second gripping device grips and places the pressing tool from the output end of the third continuous conveyor belt to the buffering mechanism; and
   the carrying mechanism comprises a power unit and a manipulator; the manipulator is located above the first horizontal section; and the manipulator carries the pressing tool on the buffering mechanism to the second front film.

* * * * *